United States Patent [19]

Ayers

[11] Patent Number: 5,022,695
[45] Date of Patent: Jun. 11, 1991

[54] SEMICONDUCTOR SLICE HOLDER

[75] Inventor: Joe W. Ayers, Sherman, Tex.

[73] Assignee: Texas Instruments Incorporated, Dallas, Tex.

[21] Appl. No.: 426,515

[22] Filed: Oct. 24, 1989

Related U.S. Application Data

[63] Continuation of Ser. No. 304,009, Jan. 30, 1989, abandoned, which is a continuation of Ser. No. 89,205, Aug. 25, 1987, abandoned.

[51] Int. Cl.$^5$ .......................... B25J 9/00; B25J 15/02
[52] U.S. Cl. .................................. 294/88; 294/103.1; 414/416; 901/39
[58] Field of Search ............... 414/416, 417, 331, 225, 414/751, 741, 786, 730, 744.8; 901/36, 38, 39; 294/86.4, 88, 103.1, 907

[56] References Cited

U.S. PATENT DOCUMENTS

| 4,586,743 | 5/1986 | Edwards et al. ................ 294/86.4 |
| 4,634,107 | 1/1987 | Vandersyde et al. ........ 414/730 X |
| 4,639,028 | 1/1987 | Olson .......................... 294/103.1 X |

FOREIGN PATENT DOCUMENTS 2171978 9/1986 United Kingdom ............ 294/103.1

Primary Examiner—David A. Bucci
Attorney, Agent, or Firm—B. Peter Barndt; James T. Comfort; Melvin Sharp

[57] ABSTRACT

A slice handling apparatus (10) is mounted on a robot arm (12) to provide automated processing of semiconductor slices (69). The slice handling apparatus (10) has three tines, a center tine (50) and two side tines (62). The side tines (62) are fixed to position, while the center tine (50) is moved in and out using a control field actuator (20). A Hall effect sensor (26) on the control field actuator (20) provides an electrical feedback to provide a firm gripping force with reduce damage to slice edges by sensitive control of the gripping force. The tines (50, 62) have locator pins (58) which hold the slice (69). The locator pins (58) have a tapered bottom portion (84) and a vertical holding portion (86). The tapered bottom portion (84) prevents the slice (69) from contacting the tines (50, 62) in the event that the slice handling apparatus (10) is not positioned at the exact vertical position desired.

14 Claims, 3 Drawing Sheets

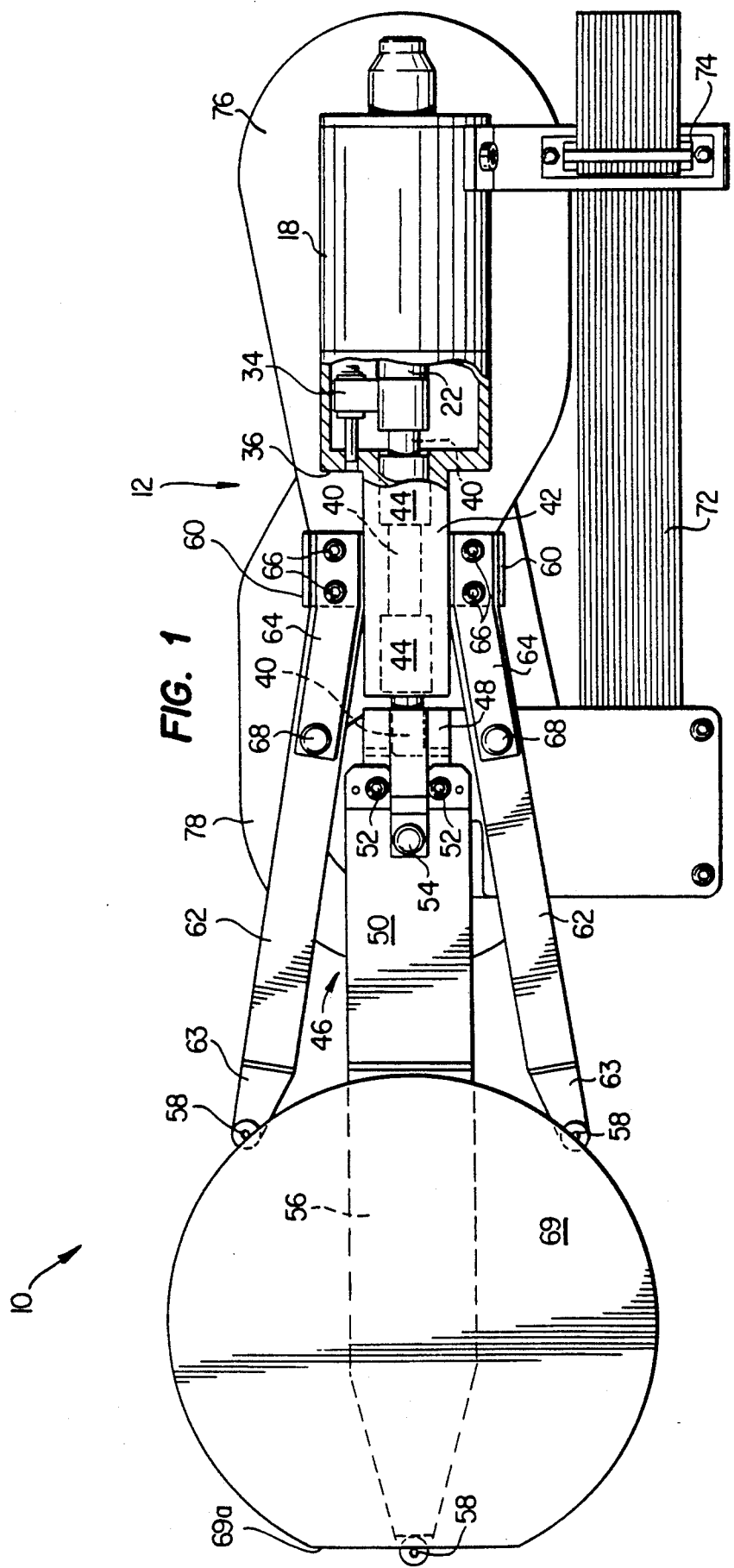

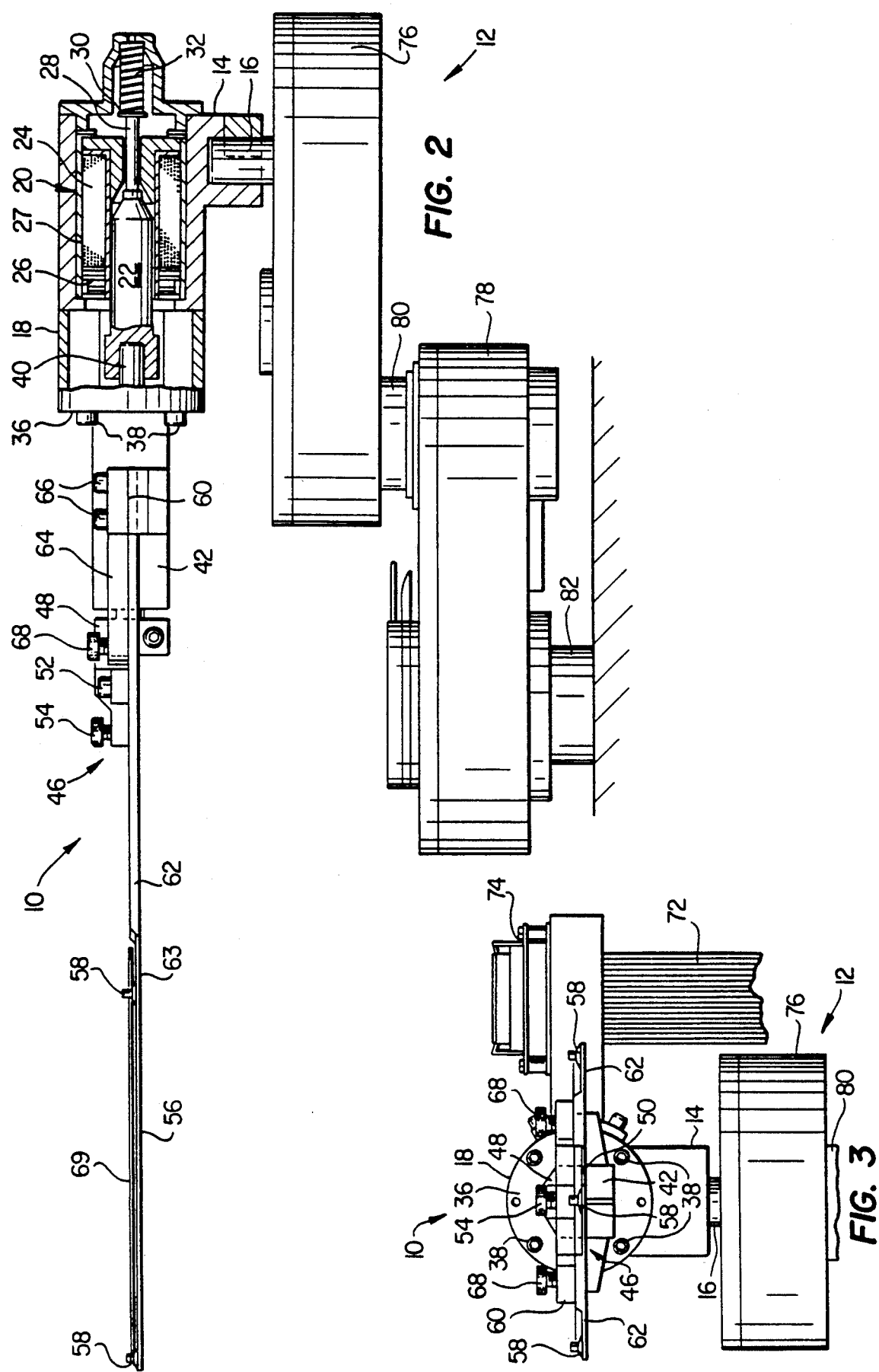

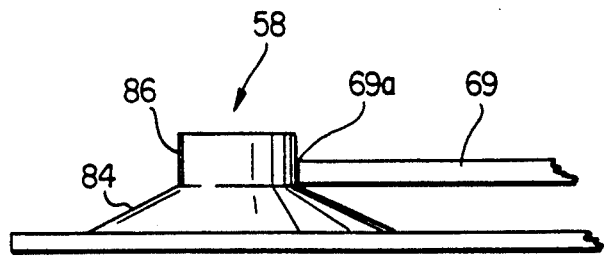
FIG. 4
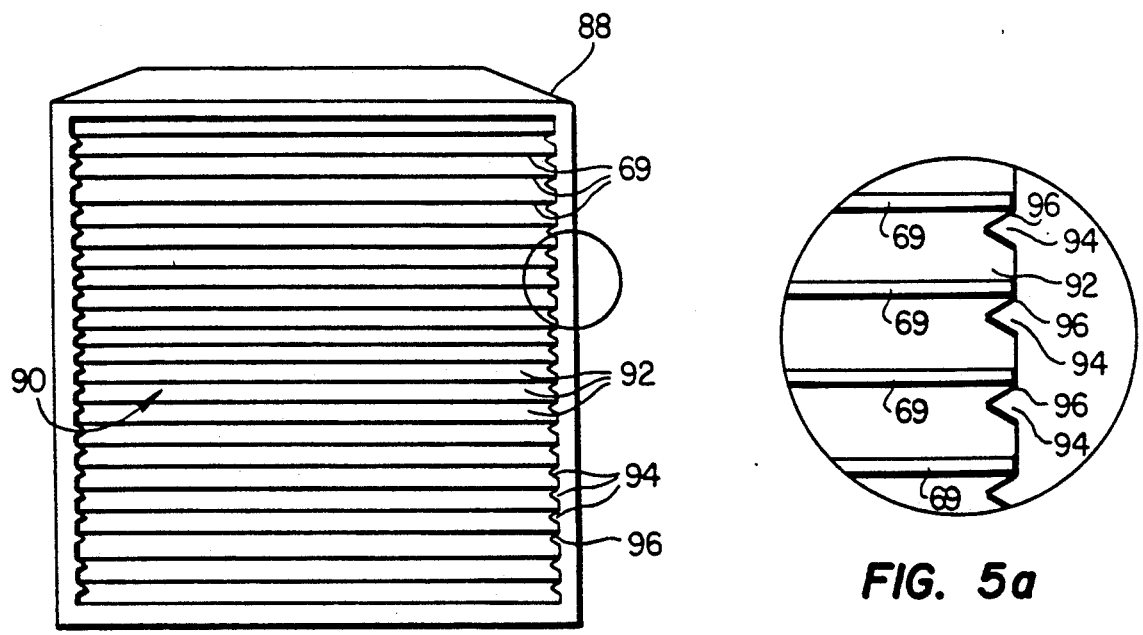
FIG. 5
FIG. 5a

SEMICONDUCTOR SLICE HOLDER

This application is a continuation of application Ser. No. 07/304,009, filed Jan. 30, 1989, which is a continuation of 089,205 filed Aug. 25, 1987, now abandoned.

TECHNICAL FIELD OF THE INVENTION

This invention relates in general to automatic semiconductor processing equipment and methods, and more particularly to a method and apparatus for transporting semiconductor wafers to and from a semiconductor cassette.

BACKGROUND OF THE INVENTION

In semiconductor fabrication, it is desirable to employ automated handling of the semiconductor slices for efficient processing of the slices. Normally, the slices are contained in a carrier cassette which holds a stack of semiconductor slices. During the automated processing of the semiconductor slices, the slices are removed from and replaced into the cassette. While being moved, the slices must be held securely, but gently, and must not interfere with adjacent slices in the cassette. Preferably, the handling apparatus should minimize contact with the surfaces of the slice.

Previously developed slice handling equipment generally use an elevator mechanism on the cassette to present the semiconductor slice to the handling apparatus. Typically, the handling equipment comprises an "O" ring belt or "air track" slice transfer mechanism. These mechanisms require the lowest slice to be removed from the cassette first, and the highest slot in the receiving cassette to be loaded first. Also, the slice cannot be processed with the active surface face down as desired.

Robotic handling of slices, as opposed to "O" ring belt or "air track" handling, requires the use of an end effector. Such end effectors suffer from several deficiencies. First, when the slices are handled in a vacuum, the slice is normally held in a partial cavity to limit side motion of the slice during transit, necessitating the loading of the slice into the end effector with the slice's active surface (surface undergoing processing) facing upward; otherwise, the edges of the slice would be damaged during transfer. However, recent studies have shown that processing with the active surface of the slice facing downward prevents contamination by undesirable particles in the chamber during processing. Therefore, the previously developed slice handling equipment is not operable to hold the slice in the most desirable position.

Second, the end effectors require a large cleared space directly beneath the slice, mandating that only the bottom slice in the cassette be removed. Thus, the handling equipment was not able to extract a single slice from any position within the cassette, without disturbing the slice below.

Third, slice handling end effectors normally use a vacuum as the holding force. This requires hoses and tubes that restrict motion of the handling apparatus. Also, these end effectors are not suitable for processing within a vacuum where the pressure differs, and thus wherein the holding force would be zero.

Thus, a need has arisen in the industry for a slice holding apparatus operable to remove and reinsert individual slices from a cassette, without damage to the semiconductor slices or to other slices within the cassette. The handling apparatus should be operable to hold the semiconductor slice with its active surface down, while maintaining a firm grip on the slice.

SUMMARY OF THE INVENTION

The present invention disclosed and claimed herein describes a method and apparatus for holding a semiconductor slice which substantially eliminates problems associated with prior slice holding apparatus.

The slice holding apparatus of the present invention comprises a plurality of tines for supporting the slice at predetermined radial positions about the edge of the slice. Each of the tines has an associated holding pin which allows the slice to be held at an elevated position above the tines to prevent interaction between the tines and the semiconductor slice. One of the tines is movable in response to a control signal such that the slice can be placed between the holding pins and held between the holding pins by retracting the movable tine. This aspect of the invention provides the technical advantage that the semiconductor slice is held at its edges such that the surface of the slice is not damaged by the holding apparatus.

In another aspect of the present invention, the holding force imparted by the movable tine can be sensed by control circuitry, such that a predetermined force is applied to the edge of the semiconductor slice. This provides the advantage that damage to the slice edges is minimized, resulting in minimum disturbance to the active surfaces of the slice.

In yet another aspect of the present invention, the movable tine is positioned by an actuator comprising a plunger within a magnetic coil being electrically operated to move the plunger in first and second directions. This provides the technical advantage that vacuum hoses and tubes that restrict motion of the slice holding apparatus are not needed. It provides the further advantage that particle generation is reduced within the processing chamber since the slice holding apparatus has only one moving part with minimum mechanical interaction.

In a further aspect of the present invention, the holding pins associated with the tines have a tapered bottom section, such that if a slice is gripped by the bottom section, it will slide upwards towards the holding portion of the holding pins, without damage to the edge of the slice. This provides the advantage that the position of the slice holding apparatus may deviate from an ideal position without damage to the slice.

In yet a further aspect of the invention, the center tine is dimensioned to move between slices in the cassette, thereby allowing random access to any particular slice in the cassette, regardless of the presence of slices in adjacent slots in the cassette.

BRIEF DESCRIPTION OF THE DRAWINGS

For a more complete understanding of the present invention and the advantages thereof, reference is now made to the following description now taken in conjunction with the accompanying drawings in which:

FIG. 1 illustrates a top plan view of the slice handling apparatus of the present invention having a cutaway view of the ball-bearing mechanism;

FIG. 2 illustrates a side plan view of the slice handling apparatus of the present invention having a cutaway view of the control field actuator;

FIG. 3 illustrates a front plan view of the slice handling apparatus of the present invention;

FIG. 4 illustrates a side plan view of the locator pin of the present invention; and FIG. 5 illustrates a semiconductor slice cassette tray for use with the slice handling apparatus.

FIG. 5a is a magnified view of the area within the circle shown in FIG. 5.

DETAILED DESCRIPTION OF THE INVENTION

For a more complete understanding of the present invention, reference is now made to FIGS. 1-5 of the drawings, like numerals being used for like and corresponding parts of the various drawings.

FIGS. 1-3 illustrate plan views of the slice handling apparatus of the present invention. The slice handling apparatus 10 is connected to a robot arm 12. The slice handling apparatus 10 has a mounting block 14 for connecting to the robot arm 12 using a shaft 16. The mounting block 14 is connected to the housing 18 for a control field actuator 20. The control field actuator 20 comprises a plunger 22 within a magnetic coil 24 and a Hall effect sensor 26. The magnetic coil 24 and Hall effect sensor 26 are surrounded by a steel shell 27. The plunger 22 has a return shaft 28 connected to a spring coupling 30 which interacts with a spring 32 at the back of the housing 18. The plunger 22 is prevented from rotating by an anti-rotation bushing 34, also contained within the housing 18.

A front plate 36 is mounted to the housing 18 using allen screws 38. A shaft 40 is connected to the front end of the plunger 22. The shaft 40 extends through the front plate 36, into a shaft housing 42. Within the shaft housing 42, the shaft 40 is guided by ball bushings 44. The shaft 40 protrudes through the shaft housing 42 where it connects to a center tine assembly 46. The center tine assembly 46 comprises a mounting block 48 into which the shaft 40 is secured. A center tine 50 is fastened to the mounting block 48 using allen screws 52. A center tine leveling screw 54 is operable to raise and lower the center tine 50. The center tine 50 has a recessed portion 56 which has an upper surface slightly below that of the rest of the tine 50. A locator pin 58 is connected to the end of the center tine 50.

Two side mounting blocks 60 flank the sides of the shaft housing 42. Side tines 62 having recessed portions 63 are attached to the side mounting blocks 60 and to adjusting blocks 64 using hex nuts 66. Locator pins 58 are located at the ends of the side tines 62. Leveling screws 68 are used to adjust the level of the side tines 62. A semiconductor slice 69 is illustrated as it is held between locator pins 58. The semiconductor slice 69 is substantially circular in shape, having a flat portion 69a, which interacts with the locator pin 58 of the center tine 50.

Control circuitry (not shown) is connected to the control field actuator through ribbon cable 72 and connector 74.

In the illustrated embodiment, the robot arm 12 comprises first and second arms 76 and 78, respectively, connected together by a pivoting pin 80. An elevating shaft 82 is operable to move the robot arms 76 and 78 vertically up and down.

In operation, the robot arm 12 is operable to move the slice handling apparatus 10 forward, backward, up, and down, and to rotate the arm clockwise and counterclockwise around pivoting pin 80. Although an embodiment of the robot arm is illustrated, similar arms of different designs would be able to perform the same functions, as would be known to one skilled in the art.

The control field actuator 20 is operable to move the plunger 22 forward and backward within the magnetic coil 24, and hence move the center tine assembly 46 forward and backward. When a voltage is applied to the magnetic coil 24, the plunger is pulled towards the spring 32. As the plunger 22 is pulled in, the magnetic field changes; the change in magnetic field is sensed by the Hall effect sensor 26 which sends a signal to the control circuitry in response. By sending the position-sensing feedback signal to a microprocessor in the control circuitry a closed-loop servo system with precise position control is obtained.

The return shaft 28, in conjunction with the spring 32, forces the plunger forward as voltage to the magnetic coil 24 is reduced.

The locator pins 58 are shown in further detail in FIG. 4. In an important aspect of the invention, the locator pins 48 have a tapered bottom portion 84 and a holding portion 86. As illustrated, the slice 69 is held against the holding portion 86 during transit. The tapered portion 84 provides support to the bottom of the slice 69, without contact with the slice 69 other than at the very edge portion of the slice. If the slice 69 is positioned on the tapered portion 84 below the holding portion 86, the slice 69 may be repositioned against the holding portion 86 by retracting the center tine 50, which will result in the slice 69 sliding upwards on the tapered portion 84 of the three locator pins 58 until contact is made with the holding portion 86. Since only the edge of the slice 69 is in contact with the tapered portion 84, virtually no damage will occur to the active surface of the slice 69 as a result of the sliding against the tapered portion 84, even if the slice 69 is being held with its active surface face-down.

Referring now to FIGS. 5a-b, a cassette for holding a plurality of slices 69 is illustrated. The cassette 88 is substantially cubical in shape, having an open face 90 into which slices 69 are stored. Each slice 69 is stored in a slot 92 created by ridges 94 on which the slices 69 are set. As is shown in greater detail in FIG. 5b, each ridge 94 has a slanted top surface 96 on which the slice 69 rests. As is the case with the locator pin 58, the slanted surface 96 of the ridge 94 provides a platform for the slice 69 which contacts only the very edge of the slice.

Normally, a cassette 88 will hold 20 to 30 slices 69, although the length of the cassette 88 can be designed to hold any number of slices 69. The distance between the ridges 94, and hence the height of the slots 92, will depend upon the thickness of the slice, and the thickness of the center tine 50, including the locator pin 58.

In operation, a cassette 88 being fully or partially loaded with slices 69 will be set in a processing chamber to be accessed by the slice handling apparatus 10. Normally, the processing chamber will be evacuated to prevent undesirable particles from interacting with the slices 69. To access a slice 69 from the cassette 88, the slice handling apparatus 10 is positioned by the robot arm 12 such that the top of the locator pin 58 on the center tine 50 is located just below the slice 69 which is to be loaded on to the slice handling apparatus 10. At this point, the center tine assembly 46 should be positioned such that the locator pins 58 of the three tines 50 and 62 are such that a slice 69 could be placed within the three locator pins 58 with some leeway at the periphery of the slice 69. The robot arm 12 is then commanded to move the slice handling apparatus 10 forward into the cassette, such that the center tine 50 is positioned with its locator pin 58 behind the back edge 69a of the slice 69. The robot arm then moves the slice handling apparatus 10 upwards, such that the bottom surface of the slice 69 is in line with a point approximately at the junction between the tapered bottom portion 84 and the holding portion 86 of the locator pin 58.

With the slice handling apparatus 10 at the proper vertical location, the entire slice handling apparatus 10 is moved forward such that the locator pins 58 of the side tines 62 are in contact with the edge of the slice 69. The center tine 50 is pulled back, by increasing the voltage to the magnetic coil, to a point where the slice 69 is in contact with the holding portion 86 of the three locator pins 58. The robot arm 12 then moves the slice handling apparatus 10 slightly upwards so that the slice 69 is positioned in the center of the slot 92 in between the ridges 94, such that the slice 69 does not slide against the ridges 94 during removal. The slice handling apparatus is then pulled directly backward from the cassette 88 by the robot arm 12 until the slice 69 is clear of the cassette 88.

Despite the slanted top surface 96 of the ridges 94, it is important that the slice 69 not slide against the ridge 94, since the frictional forces could cause damage to the slice 69. Hence, it is important that the slice 69 be moved to the center of the slot 92 before removal.

Ideally, the slice handling apparatus 10 is vertically positioned such that the bottom of the slice 69 is on a vertical level with the top of the tapered bottom portion 84 of the locator pin 58. If the robotic arm 12 cannot be programmed to position the slice handling apparatus 10 at precisely this vertical position, the slice handling apparatus 10 should be positioned such that the bottom of the slice 69 is just below the holding portion 86, in line with the tapered bottom portion 84. As the center tine 50 is pulled inward, the slice 69 will slide up the tapered bottom portion 84. Preferably, the slice is positioned as far up on the tapered bottom portion 84 as possible, so as to minimize the amount of sliding necessary.

The slice 69 may be returned to the cassette by reversing the procedure used to remove the slice 69. The slice handling apparatus 10 is placed in a vertical position such that the slice 69 held by the slice handling apparatus 10 is located vertically at the center of the slot 92 in which it is to be placed. The slice handling apparatus 10 is moved forward by the robot arm 12 such that the slice 69 is placed within the slot 92 at its proper horizontal position. The slice handling apparatus 10 is then lowered by the robot arm 12 such that the slice 69 makes light contact with the ridges 94 of the cassette 88. The center tine is moved forward to release the slice 69 and the slice handling apparatus 10 is moved slightly backwards so that the locator pins 58 associated with the side pins 62 are clear of the slice 69. The slice handling apparatus 10 is moved vertically downward such that the tops of the locator pins 58 are slightly below the slice 69 and that the slice handling apparatus 10 can be removed from the cassette 58 without disturbing any of the other slices 69.

Since the distance between slices 69 in the cassette 68 should be set as small as possible, and since the tines 50 and 62 should not make contact with the slice 69, it is important that the tines be adjusted to be exactly level with the slices 69. The leveling screws 58 should be set once per setup to ensure that the tines are properly positioned. First, the center tine 50 is adjusted by placing a bubble level on the center tine, and adjusting the leveling screw 54 to level the center tine. A slice 69 is then placed on the slice handling apparatus 10 and the control field actuator is actuated to grip the slice 69 as described above. The bubble level is placed in the center of the slice 69 and the side tines 62 are positioned using their associated leveling screws 58 such that the bubble level shows a perfectly level slice 69.

In one aspect of the invention, the Hall effect sensor 26 senses when the slice 69 is gripped within the three locator pins, as the backward motion of the center tine 50 is inhibited. As the center tine is stopped, the electric power requirements of the coil 24 are changed, which is sensed by the Hall effect sensor 26. The Hall effect sensor 26 sends a signal to the control circuitry to adjust the current to the coil 24, such that a predetermined force is applied to restrain, but not damage, the slice 69. This provides the technical advantage that a firm, but safe, force is applied to the slice 69 using a feedback mechanism.

If no slice is available in the slot 92 being accessed by the slice handling apparatus 10, the electric power requirements over the time during which the center tine assembly 46 is retracted will indicate that no slice was encountered. By measuring motion, time and the electrical current requirements of the coil 24, a signal is generated to indicate that no slice is available for transport. This provides the technical advantage that integral "slice present" sensing is available without using external sensors.

The present invention also provides the technical advantage that particle generation by the slice handling apparatus 10 is reduced. The slice handling apparatus 10 has only one moving part, the control field actuator 20, in which there is minimal abrasion between mechanical parts. This reduces particle generation, and thus reduces the presence of damaging particles within the process chamber.

Due to the design of the slice handling apparatus 10, any slice within the cassette may be accessed without interference with other slices in the cassette. During removal or insertion of a slice in the cassette, only the tine portions 58 and 60 are placed within the cassette 88. By using an accurate robot arm 12, the tines can be placed between slices 69 to access a particular slice. This provides the technical advantage that slices can be randomly accessed from the cassette, and that a single cassette can be used for holding both processed and unprocessed slices.

Since the slice is gripped by moving the center tine 50, the slice handling apparatus 10 may be adapted to different slice diameters. If necessary, the side tine 62 can be positioned to accommodate slices of different diameters.

Because the slice handling apparatus 10 is electrically operated using the control field actuator 20, slices 69 can be gripped without the use of a vacuum. This provides the advantage that the slice handling apparatus 10 of the present invention can be used in vacuum processing without losing gripping force and also that hoses and tubes which restrict motion are not present.

The slice handling apparatus 10 of the present invention may be used with a variety of automatic processing systems and provides an important function within the processing system in accordance with the above stated advantages.

Although the present invention has been described in detail, it should be understood that various changes, substitutions and alterations can be made herein without departing from the spirit and scope of the invention as defined by the appended claims.

What is claimed is:

1. Apparatus for holding a semiconductor slice during processing, comprising:
   (a) a plurality of tines including a movable center tine and fixed tines on opposite sides of said center tine, each said tine having an end portion and said center tine having an upper surface and a recessed portion on said upper surface extending immediately below the slice;
   (b) plural holding pins, one said holding pins secured to an end portion of each of said tines, one of said holding pins being offset from a line passing through the other of said holding pins for holding said slice against movement relative to said holding pins;
   (c) an electrically activatable magnetic coil, and
   (d) a plunger within said magnetic coil coupled to said center tine, said magnetic coil being electrically activatable to move said plunger axially of said magnetic coil, and
   (e) means responsive to the instantaneous axial position of said plunger to control said magnetic coil and cause said plunger to stop at a predetermined location.

2. The apparatus of claim 1, wherein said plurality of tines is three tines.

3. The apparatus of claim 2, wherein said three tines are substantially coplanar.

4. The apparatus of claim 3, wherein said three tines are disposed radially from the approximate location of said magnetic coil.

5. The apparatus of claim 1 wherein said means responsive to the position of said plunger includes a hall effect sensor disposed to detect the axial position of said plunger, 6. The apparatus of claim 1, wherein each of said holding pins includes a sloped side portion, extending outwardly from said tine and forming an obtuse angle with said tine and an adjoining substantially constant cross section portion to help seat the slice between said holding pins and spaced from said tine.

7. Apparatus for holding a semiconductor slice during processing, comprising:
   three, substantially coplanar, radially disposed tines for supporting the slice, where a middle tine is movable radially and said middle tine having an upper surface and a recessed portion on said upper surface extending immediately below the slice;
   a holding pin mounted at the distal end of each of said three tines; and
   control field actuator means for moving said middle tine in said radial direction and for sensing the radial position of said middle tine.

8. The apparatus of claim 7, further comprising:
   control field actuator housing means for covering said control field actuator means.

9. The apparatus of claim 8, further comprising:
   shaft means for connecting said middle tine with said control field actuator means.

10. The apparatus of claim 9, further comprising:
    shaft housing means for covering said shaft means.

11. A method of holding a semiconductor slice during processing, comprising:
    providing three, substantially coplanar, radially disposed tines for supporting the slice, where a middle tine is movable radially and said middle tine having an upper surface and a recessed portion on said upper surface extending immediately below the slice;
    providing a holding pin mounted at the distal end of each of said three tines; and
    providing control field actuator means for moving said middle tine in said radial direction and for sensing the radial position of said middle tine.

12. The method of claim 11, further comprising the step of:
    providing control field actuator housing means for covering said control field actuator means.

13. The method of claim 12, further comprising the step of:
    providing shaft means for connecting said middle tine with said control field actuator means.

14. The method of claim 13, further comprising the step of:
    providing shaft housing means for covering said shaft means.

* * * * *